United States Patent [19]
Aoki et al.

[11] Patent Number: 4,948,231
[45] Date of Patent: Aug. 14, 1990

[54] LIQUID CRYSTAL DISPLAY DEVICE AND METHOD OF MANUFACTURING THE SAME

[75] Inventors: Shigeo Aoki, Habikino; Yasuhiro Ugai, Yao; Katsumi Miyake, Nara; Kotaro Okamoto, Hino, all of Japan

[73] Assignee: Hosiden Electronics Co. Ltd., Osaka, Japan

[21] Appl. No.: 300,688

[22] Filed: Jan. 18, 1989

Related U.S. Application Data

[63] Continuation of Ser. No. 812,885, Dec. 4, 1985, abandoned.

[30] Foreign Application Priority Data

Apr. 9, 1984 [JP] Japan .................................. 59-70440

[51] Int. Cl.5 .............................................. G02F 1/13
[52] U.S. Cl. .................................... 350/334; 350/333; 357/23.7; 357/30
[58] Field of Search ..................... 350/334, 339 F, 332, 350/333; 357/23.7, 30 L

[56] References Cited

U.S. PATENT DOCUMENTS

| | | | |
|---|---|---|---|
| 3,405,331 | 10/1968 | Skalski et al. | 357/23.7 X |
| 3,660,732 | 5/1972 | Allison | 357/23.7 |
| 4,006,968 | 2/1977 | Ernstoff et al. | 350/339 F |
| 4,169,746 | 10/1979 | Ipri et al. | 357/23.7 X |
| 4,644,338 | 2/1987 | Aoki et al. | 350/334 |
| 4,653,862 | 3/1987 | Morozumi | 350/339 F |

FOREIGN PATENT DOCUMENTS

| | | | |
|---|---|---|---|
| 0107287 | 8/1981 | Japan . | |
| 0159516 | 9/1983 | Japan | 350/334 |
| 0222546 | 12/1983 | Japan | 357/30 L |
| 2118365 | 10/1983 | United Kingdom | 357/23.7 |

OTHER PUBLICATIONS

Richard S. Muller & Theodore I. Kamins, *Device Electronics For Integrated Circuits*, John Wiley & Sons, Inc., pp. 42-52.
IC Update "Process for P-Channel SOS/MOS" Electronic Products Magazine, Jan. 15, 1973.

*Primary Examiner*—Stanley D. Miller
*Assistant Examiner*—Huy K. Mai
*Attorney, Agent, or Firm*—Pollock, Vande Sande and Priddy

[57] ABSTRACT

A liquid crystal display device comprises a plurality of display electrodes which are selectively energized through on-off control of thin film transistors. In order to reduce the channel length of the thin film transistors to increase operation speed and obtain uniform characteristics, each display electrode and an associated transistor source electrode is formed on one of a pair of transparent substrates of the liquid crystal display device, a semiconductor layer is formed between the display layer and source electrode, a gate insulating film is formed on the semiconductor electrode, and a gate electrode is formed on a portion of the gate insulating film between the display electrode and source electrode. Then, ions are implanted into the semiconductor layer with the gate electrode used as a mask, thus rendering portions of the semiconductor layer contiguous to the display electrode and source electrode into ohmic layers. A channel is thus obtained between the ohmic layers with its length determined by the length of the gate electrode.

7 Claims, 8 Drawing Sheets

LIQUID CRYSTAL DISPLAY DEVICE AND METHOD OF MANUFACTURING THE SAME

This application is a continuation of Ser. No. 812,885, filed on Dec. 4, 1985, abandoned.

FIELD OF THE INVENTION

This invention relates to a liquid crystal display device used for displaying images, for instance, which has a plurality of display electrodes provided in a liquid crystal cell and selectively driven for display by thin film transistors.

PRIOR ART

FIG. 1 shows a prior art liquid crystal display device structure of the conventional type. The device comprises a pair of glass or like transparent substrates 11 and 12 facing each other and spaced apart by a spacer 13 provided therebetween along the edges. Liquid crystal 14 is sealed between substrates 11 and 12. Substrates 11 and 12, spacer 13 and liquid crystal 14 constitute a liquid crystal cell. Formed on the inner surface of substrate 11, for instance, are a plurality of display electrodes 15 constituted by a transparent conductive film. Thin film transistors 16 are formed contiguous to display electrodes 15 with their drains connected thereto and serve as switching elements. Common electrode 17 is formed on the entire inner surface of the other transparent substrate 12 and faces display electrodes 15.

Display electrodes 15 may serve as picture element electrodes. They are square in shape and are arranged in a closely spaced-apart relation to one another, as shown in FIG. 2. More specifically, they are arranged in rows and columns on transparent substrate 11. Gate buses 18 are formed near and along the individual rows of display electrodes 15. Source buses 19 are formed near and along the individual columns of display electrodes 15. Thin film transistors 16 noted above are formed at the intersections of gate and source buses 18 and 19. More specifically, each thin film transistor 16 is formed with its gate connected to an associated gate bus 18, its source connected to an associated source bus 19 and its drain connected to the corresponding display electrode 15.

In operation, a voltage is applied between a selected one of gate buses 18 and a selected one of source buses 19. The corresponding thin film transistor 16 is turned on as a result, whereby charge is stored on the display electrode 15 connected to the drain of this "on" thin film transistor 16. A voltage is applied across a portion of liquid crystal 14 that is found between this display electrode and common electrode 17. This display electrode alone is thus rendered transparent or opaque. Only selected display electrodes are rendered transparent or opaque in this way, whereby a corresponding display image is formed. Usually, a polarizer (not shown) is incorporated to render selected display electrodes transparent or opaque.

Each thin film transistor 16 usually has a structure as shown in FIGS. 3 and 4. Referring to the Figures, display electrodes 15 and source buses 19 are formed from a transparent conductive film, e.g., an ITO film, which is formed on transparent substrate 11. Semiconductor layers 21 of amorphous silicon or the like are formed such that each of them strides portions of a corresponding display electrode 15 and source bus 19 which extend parallel to and are closely spaced apart from each other. Gate insulating film 22 of silicon nitride or the like is formed on semiconductor layers 21. Gate electrodes 23 are formed on gate insulating film 22 such that they overlie portions of display electrodes 15 and source buses 19 via the semiconductor layers 21. The gate electrodes 23 are each connected at one ends to the corresponding gate buses 18. Portions of the display electrodes 15 and source bus 19 facing each gate electrode 23 serve as drain and source electrodes 15a and 19a, respectively. Each thin film transistor 16 is constituted by corresponding electrodes 15a and 19a, semiconductor layer 21, gate insulating film 22 and gate electrode 23. Gate electrodes 23 and gate buses 18 are formed at the same time from aluminum, for instance.

This example of a liquid crystal device is used for color display and has red, green and blue filters 1R, 1G and 1B provided on the side of transparent substrate 12. Filters 1R, 1G and 1B each face a corresponding display electrode 15. These color filters are distributed substantially uniformly as shown in FIG. 3.

In the prior art liquid crystal display device as described above, it is desired to reduce the turning-on time of thin film transistors 16 and increase the drain current therein. For these reasons, it is desired to reduce the distance between source and drain electrodes 19a and 15a, i.e., so-called channel length L (see FIG. 5). Meanwhile, it is required to make the dimension of gate electrode 23 in the direction of arrangement of source and drain electrodes 19a and 15a, i.e., so-called gate electrode length Lg, greater than channel length L noted above. In addition, it is required that the opposite ends of gate electrode 23 be located over source and drain electrodes 19a and 15a via semiconductor layer 21 and gate insulating film 22 and that no gap be formed between the opposite ends of gate electrode 23 and corresponding source and drain electrodes 19a and 15a when the device is viewed in the perpendicular direction to the substrate 11. To reduce channel length L, therefore, requires accurate relative positioning of a mask, which is used for photo-etching to form gate electrode 23, and a mask which is used for photo-etching to form source and drain electrodes 19a and 15a. This requirement imposes a lower limit on channel length L. In addition, a reduction of channel length L means a corresponding increase of the ratio of lengths $L_1$ and $L_2$ of portions of the gate electrode 23 overlying drain and source electrodes 15a and 19a to channel length L. This means a corresponding increase of the parasitic capacitance due to the overlying portions, resulting in a reduced switching speed and an increased "on" resistance of thin film transistor 16.

To overcome this drawback, it has been proposed to reduce the gate electrode portions overlying the source and drain electrodes. According to this proposal, an amorphous silicon layer is formed on the transparent substrate, and a silicon dioxide layer is formed on the amorphous silicon layer. A window is then formed in the silicon dioxide layer, then a gate insulating film is formed, and a gate electrode is formed on the gate insulating film in correspondence to the window. Arsenic ions are then implanted into the amorphous silicon layer noted above with the gate electrode and silicon dioxide layer in the window used as a mask. Thereafter, the system is subjected to laser annealing to render the ion-implanted portions into low resistivity portions which constitute source and drain electrodes. A thin film transistor is thus obtained, which has a reduced channel length and reduced overlying gate electrode portions over the source and drain electrodes. In this method, however, an insulating protective film is formed subsequent to the laser annealing treatment, which insulating protective film is then formed with holes reaching the source and drain electrodes, and then leads are connected to the source and drain electrodes through these holes. Where this thin film transistor is used for a liquid crystal display device, it is further necessary to form a passivation film to avoid influence of the leads on the liquid crystal.

Where transmissive display is carried out, a light source 24 is provided behind transparent substrate 11, as shown in FIG. 4. More specifically, light from light source 24 is transmitted through the liquid crystal display device according to the controlled state of the liquid crystal cell. The display state of the device can be seen from the side of transparent substrate 12. External light, however, enters the liquid crystal display device from the side of transparent substrate 11. This is also the case with a liquid crystal display device of the reflection type.

Semiconductor layer 21, particularly amorphous silicon, has photo-conductivity. Semiconductor layer 21 is receiving light from light source 24 and/or external light at all times. Therefore, the "off" current in thin film transistor 16 when the thin film transistor is "off" can not be made sufficiently small, that is, the on-to-off current ratio of thin film transistor 16 can not be made sufficiently large. This is undesired from the standpoint of sufficient contrast, particularly when the thin film transistor 16 is driven in a high duty cycle operation.

The liquid crystal display device further comprises a polarizer though not shown, which is provided on either side surface of the liquid crystal cell. The device may be either of a normally black type or so-called negative type where no light is transmitted unless a voltage is applied between common electrode 17 and any display electrode 15 or of a normally white type or so-called positive type where light is transmitted in the absence of voltage applied between common electrode 17 and display electrode 15.

In the prior art liquid crystal display device as shown in FIG. 4, light 25 is transmitted through portions other than the picture elements, i.e., between adjacent color filters. Light 26 is also transmitted through portions of the color filters not facing picture element electrodes 15. Such transmitted light 25, 26 reduces the display contrast and color purity of the liquid crystal display device and hence deteriorates the image quality. Particularly in a device of the normally white type, the same light as that of a 100% white level which is transmitted through a picture element is transmitted through portions between adjacent color filters and has a great adverse effect on the image quality.

There have been attempts to prevent deterioration of the on-to-off current ratio due to light incident on semiconductor layer 21 as noted above by forming a light-blocking layer for semiconductor layer 21. The light-blocking layer is formed to block light and prevent it from reaching semiconductor layer 21. Usually, however, such a light-blocking layer requires an extra step of manufacture.

An object of the present invention is to provide a liquid crystal display device which permits reduction of the channel length as well as the "on" resistance and parasitic capacitance of thin film transistors to increase the switching speed and also can reduce fluctuations of the switching characteristics, as well as a method of manufacturing such a liquid crystal display device.

Another object of the invention is to provide a liquid crystal display device which has an increased thin film transistor on-to-off current ratio, can be manufactured comparatively easily and permits increasing the switching speed, as well as a method of manufacturing such a liquid crystal display device.

A further object of the invention is to provide a liquid crystal display device with which an image display of high contrast and satisfactory image quality can be obtained, as well as a method of manufacturing such a liquid crystal display device.

SUMMARY OF THE INVENTION

The liquid crystal display device according to the invention basically has a structure which comprises a pair of transparent substrates closely spaced apart and facing each other, a liquid crystal sealed between the transparent substrates, a plurality of display electrodes provided on the inner surface of one of the transparent substrates, and thin film transistors formed on the same transparent substrate and each having the drain connected to each display electrode, the thin film transistors being selectively controlled for switching to selectively energize the display electrodes for display. Each of the thin film transistors includes a source electrode and a drain electrode (inclusive of display electrode) both formed on the transparent substrate, a semiconductor layer formed across between these two electrodes, a gate insulating film formed on the semiconductor layer, and a gate electrode formed on the gate insulating film. Particularly, according to the invention the length dimension of the gate electrode is set to be smaller than the corresponding dimension of the gap between the source and drain electrodes, and ions are implanted into the semiconductor layer with the gate electrode used as a mask to render semiconductor layer portions contiguous to the source and drain electrodes into ohmic contact layers. The gap between the ohmic contact layers constitutes the channel length. The channel length thus can be readily reduced, and also portions of the gate electrode that overlie the source and drain electrode inclusive of the ohmic layers can be extremely reduced. The parasitic capacitance and "on" resistance of the thin film transistor thus can be reduced to increase the switching speed of the thin film transistor. In addition, uniform switching characteristics can be readily obtained. It is thus possible to obtain a liquid crystal display device which can produce a display having a uniform image quality over a wide display area.

Further, an opaque metal film is formed on the transparent substrate over an area where each semiconductor layer is formed. Source buses are formed from the same material as these opaque metal layers simultaneously with the formation thereof. An insulating film is formed on the opaque metal layers and source buses. Display electrodes (inclusive of drain electrodes) and source electrodes are formed on the insulating film. The semiconductor layers, gate insulating films and gate electrodes are formed in the manner as described above. In addition, the ohmic layers are formed through the ion implantation noted above with each gate electrode used as a mask. The thin film transistor thus formed substantially does not have overlying portions of the gate electrode over the source and drain electrodes. The opaque metal layer thus prevents incidence of external light on the semiconductor layer. It is thus possible to obtain a thin film transistor which has a high on-to-off current ratio and can operate at a high speed, thus permitting a satisfactory contrast of display to be obtained. Further, second source buses are formed together with the source electrodes, and they are connected to the source buses noted above at source bus terminals. Thus, even if one of the two source buses is disconnected, the device is not rejected, that is, the yield and reliability can be improved.

Further, source buses made of an opaque metal as noted above block light and provide for a corresponding improvement of the contrast.

From the standpoint of improving the contrast of the color display device, for instance, it is desired to provide a metal light-blocking layer on the transparent substrate, which faces the other substrate with the thin film transistors, over portions of the substrate between adjacent color filters facing the gaps between adjacent display electrodes. In this case, the color purity of the color display is improved as well.

DESCRIPTION OF THE PREFERRED EMBODIMENTS

Figure 6A:
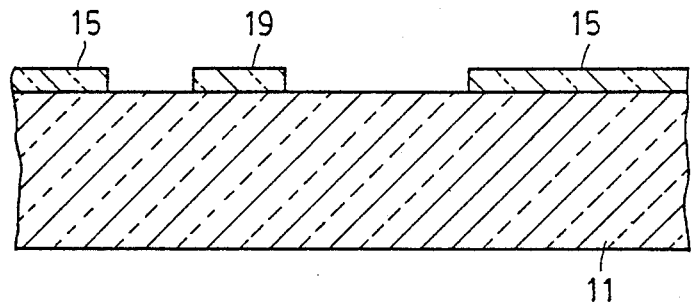
FIGS. 6A to 6E are fragmentary sectional views for explaining the process of formation of a main part of device in an embodiment of the method of manufacture according to the present invention.

The gist of the liquid crystal display device and method of manufacturing the same according to the present invention resides in the structure of the thin film transistor. Hence, this portion of the device will be described with reference to FIGS. 6A to 6E and the following Figures. As shown in FIG. 6A, source bus 19 and display electrode 15 are formed in a spaced-apart relation to one another on insulating transparent substrate 11, e.g., of glass. Source bus 19 and display electrode 15 are made of a transparent metal, e.g., ITO, and have a thickness of 3 to 500 angstroms.

Figure 6B:
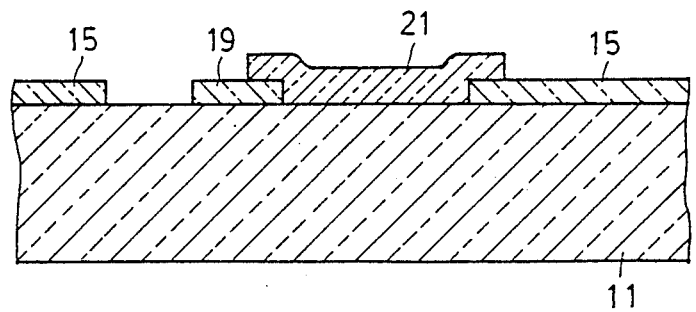

Semiconductor layer 21, e.g., of amorphous silicon, is then formed on substrate 11 such that it extends between and partly overlies source bus 19 and display electrode 15, as shown in FIG. 6B. This semiconductor layer has a thickness of 0.1 to 0.5 microns.

Figure 6C:
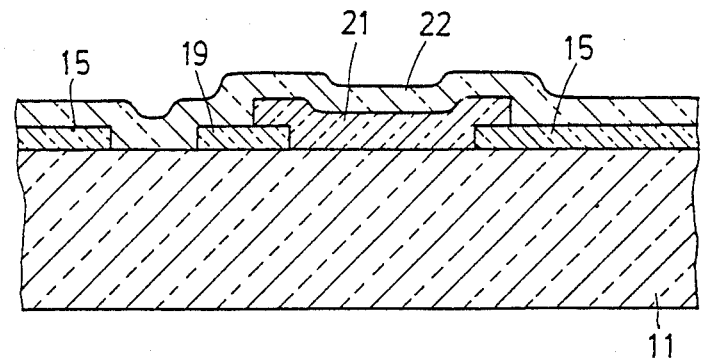

Gate insulating film 22 is then formed to cover semiconductor layer 21, as shown in FIG. 6C. For instance, this gate insulating film consists of SiNx and has a thickness of 0.1 to 0.2 microns.

Figure 6D:
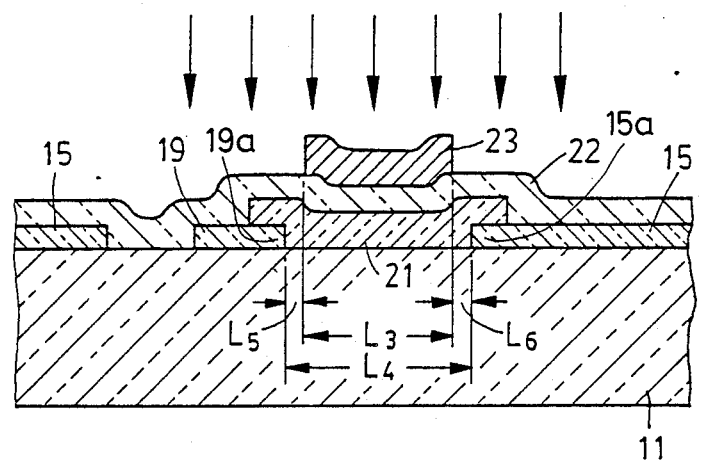

Gate electrode 23 and a gate bus (not shown) are then formed on gate insulating film 22, as shown in FIG. 6D. For instance, the gate electrode and gate bus are made of aluminum and have a thickness of about 1 micron or below. Display electrode 15, source bus 19, semiconductor layer 21, gate insulating film 22, gate electrode 23 and the gate bus noted above may be formed by various well-known processes.

According to the invention, length $L_3$ of gate electrode 23 in the direction of arrangement of source bus 19 and display electrode 15 is set to be slightly smaller than distance $L_4$ between the source electrode 19a and the drain electrode 15a. Narrow gaps $L_5$ and $L_6$ are also formed between opposite ends of the gate electrode 23 and the source electrode 19a and drain electrode 15a when viewed in the perpendicular direction to substrate 11.

Figure 6E:
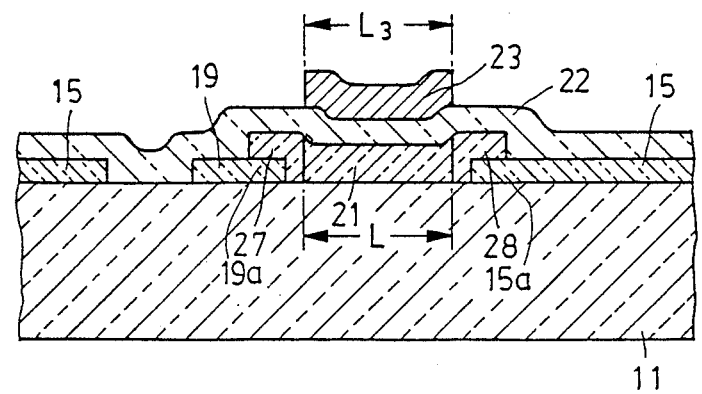

Subsequently, ions, e.g., phosphorus ions, are implanted with the gate electrode 23 used as a mask and by appropriately selecting the ion injection rate such that the injected ions reach source electrode 19a and drain electrode 15a via marginal portions 27, 28 of semiconductor layer 21 extending out from gate electrode 23, whereby ohmic contact layers 27 and 28 contiguous to the source electrode 19a and the drain electrode 15a, respectively, are formed, as shown in FIG. 6E. The ion-implanted portions of semiconductor layer 21 have an increased impurity concentration and a reduced resistivity. These portions, i.e., ohmic layers 27 and 28, also constitute source and drain regions of the semiconductor layer 21. The ion implantation may be carried out using phosphorus ions with an accelerating voltage of 20 to 70 keV to an extent of $1 \times 10^{-15}$ cm$^{-2}$, although the conditions of the ion implantation are determined depending on the specifications of semiconductor layer 21 and gate insulating film 22. The temperature of transparent substrate 11 at this time, is set to 150° to 250° C. It is also possible to use other ions than phosphorus ions, e.g., arsenic ions.

Further, if necessary, laser annealing of particularly the portions of gaps $L_5$ and $L_6$ is carried out with the gate electrode used as a mask (see FIG. 6D) to reduce the resistivity of the annealed portions of semiconductor layer 21. The laser annealing may be carried out using an argon laser of 2 to 20 W in a nitrogen atmosphere with the laser beam width set to 10 to 300 microns, the scanning speed to 1 to 50 cm/sec. and the temperature of substrate 11 to 150° to 250° C. An array of the display electrodes 15 and thin film transistors 16 is formed in the above way. Using such an array a liquid crystal display device may be produced by various well-known processes.

Now, a method of manufacture of the main part of a liquid crystal display device where no light is incident on semiconductor layers of thin film transistors, will be described with reference to FIGS. 7A to 7I.

Figure 7A:
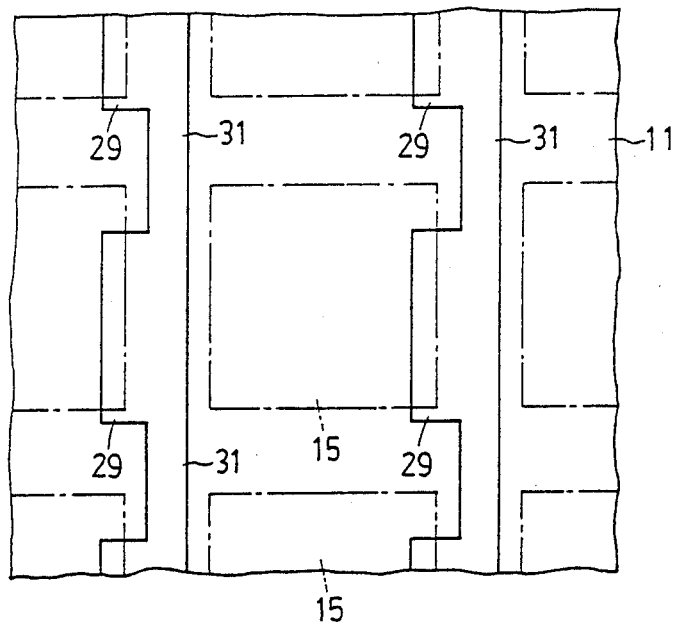
FIGS. 7A to 7I illustrate the process of formation of a part of device in a different embodiment of the method of manufacture according to the invention, with FIGS. 7A and 7H being fragmentary plan views and FIGS. 7B to 7G and 7I being sectional views.
Figure 7B:
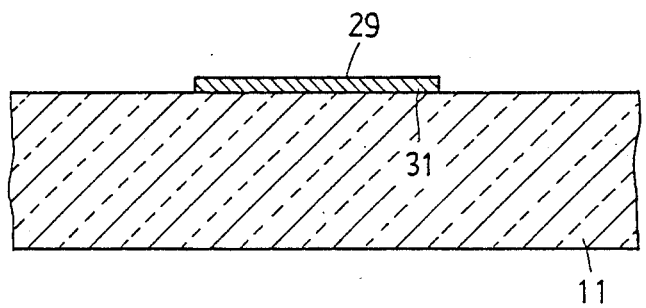

As shown in FIGS. 7A and 7B, opaque metal layer 29 is formed on areas of the transparent substrate 11 of an evential liquid crystal display device, in which areas thin film transistors 16 are to be formed. At the same time, source buses 31 of the same material as opaque metal layer 29 are formed. For instance, the opaque metal layer 29 and source bus 31 are formed by depositing chromium to a thickness of 1,000 to 2,000 angstroms on the entire surface of transparent substrate 11 and then photo-etching the deposited chromium layer. As is seen from the positional relation between the thin film transistors 16 and the source buses 19 shown in FIG. 3, the opaque metal layers 29 are actually extensions of the source buses 31 on one side thereof. In FIG. 7A, the positions of the display electrodes 15 are shown by phantom line rectangles. Also in FIG. 7A some parts are shown on an enlarged scale so that their relative sizes differ from actual ones.

Figure 7C:
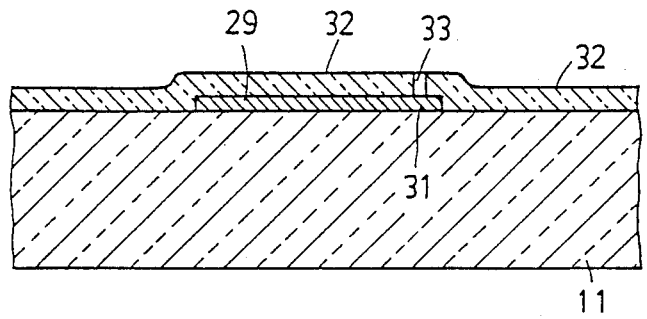

Subsequently, insulating layer 32 is formed to cover the entire surface of the transparent substrate 11 inclusive of the opaque metal layers 29 and the source buses 31, as shown in FIG. 7C. A hole 33 is made in the insulating layer 32 to correspond in position to source electrode 19a of thin film transistor 16. The insulating film 32 desirably is transparent and has a low dielectric constant. For instance, it is of SiO and has a thickness of 5,000 angstroms to 1 micron.

Figure 7D:
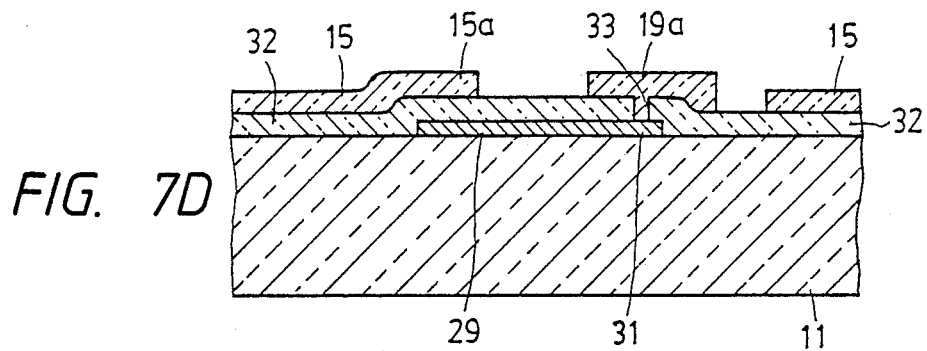

Then, drain and source electrodes 15a and 19a facing each opaque metal layer 29 are formed, as shown in FIG. 7D. At the same time, each display electrode 15 is formed on the insulating layer 32. At this time, the source electrode 19a is connected to the source bus 31 through the hole 33. That is, it is electrically connected to the opaque metal layer 29. If necessary, a second source bus 19 connected to the source electrode 19a is also formed. These electrodes 15a and the 19a and second source bus 19 are formed at the same time by depositing a transparent metal film and photo-etching the deposited film, the process being well known in the art. The second source bus 19 has the same shape as the source bus shown in FIG. 3. That is, it has substantially the same shape as and overlies the source bus 31 shown in FIG. 7A, but it does not overlie the opaque metal layer 29. Source buses 19 and 31 are directly connected together at source terminal 34, as shown in FIGS. 7H and 7I.

Figure 7E:
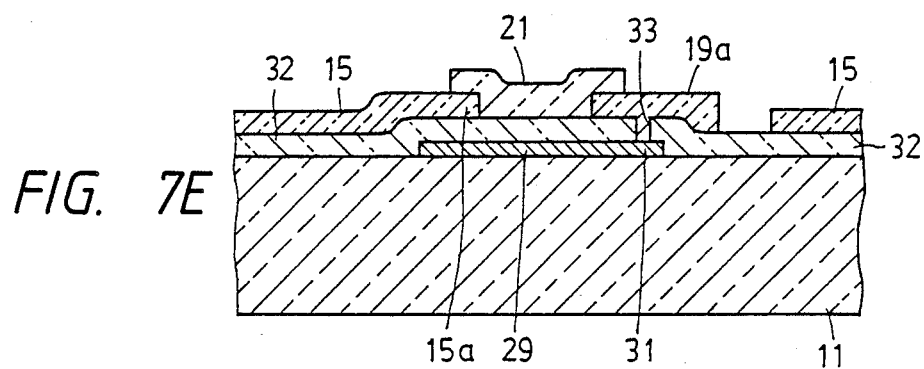

Semiconductor layer 21, e.g., of amorphous silicon, is then formed on the insulating film 32 such that it extends between and partly overlies the drain and source electrodes 15a and 19a, as shown in FIG. 7E. The semiconductor layer 21 entirely faces the opaque metal layer 29 or the source bus 31 via the insulating layer 32. Its thickness is 0.5 micron or below.

Figure 7F:
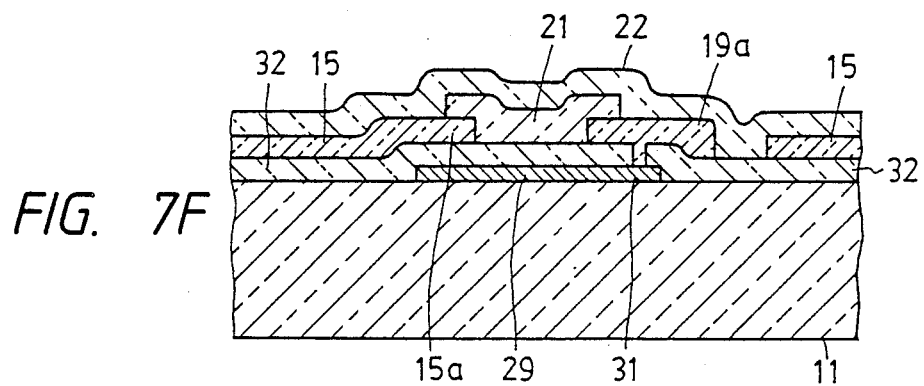
Figure 7G:
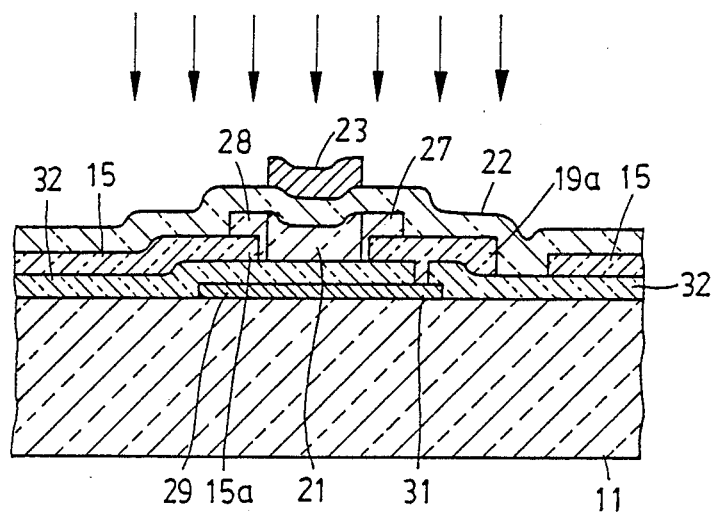
Figure 7H:
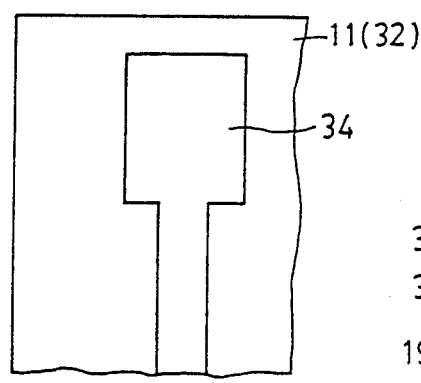
Figure 7I:
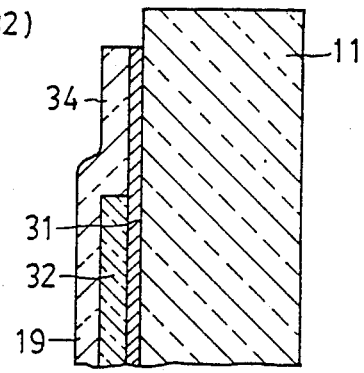

Gate insulating film 22 is then formed to cover the semiconductor layer 21 entirely, as shown in FIG. 7F. The gate insulating film 22 may be a SiNx film with a thickness of 0.5 micron or below. Then, gate electrode 23 facing the semiconductor layer 21 via the gate insulating film 22 is formed, as shown in FIG. 7G. At this time, the gate bus (not shown) is also formed. Gate electrode 23 and the gate bus may be formed from an aluminum deposition film with a thickness of 5,000 angstroms to 1 micron. The dimension of gate electrode 23 in the direction of arrangement of the source and drain electrodes, is set to the same value as described before in connection with FIG. 6D. Afterwards, ion implantation is carried out with the gate electrode 23 used as a mask to convert portions of the semiconductor layer 21 into ohmic layers 28 and 27 contiguous to the drain and source electrodes 15a and 19a. An array of the display electrodes 15 and the thin film transistors 16 is formed in the above way. A liquid crystal display device can be formed using this array.

Figure 1:
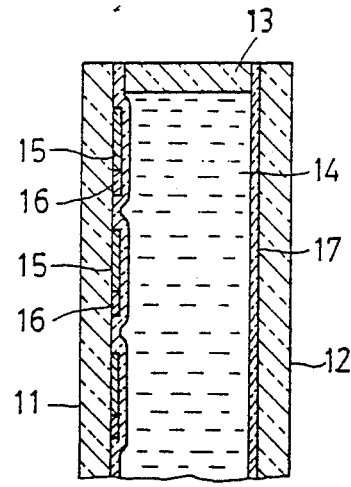
FIG. 1 is fragmentary schematic sectional view showing a liquid crystal display device.
Figure 2:
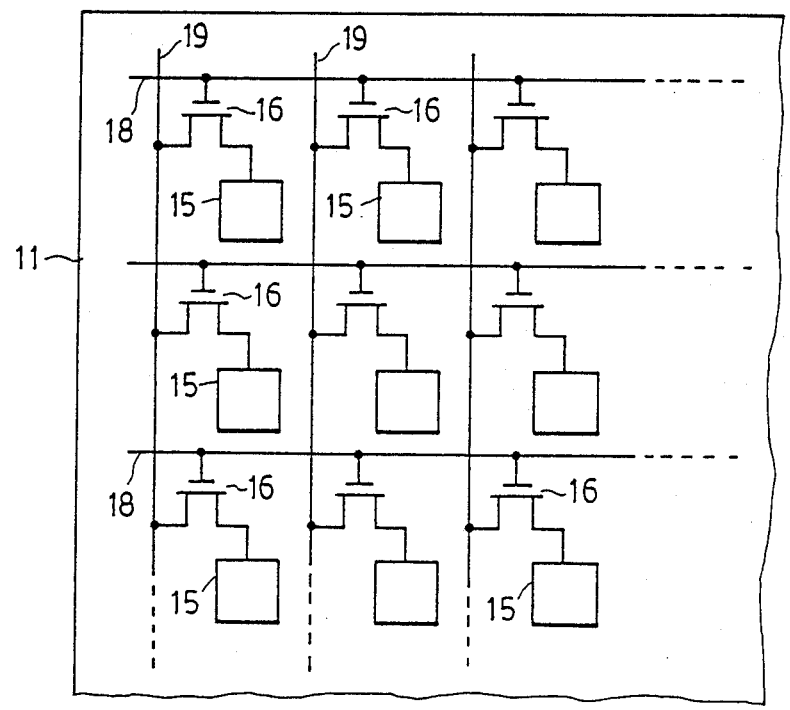
FIG. 2 is a prior art view showing an equivalent electric circuit of a liquid crystal display device of matrix type.
Figure 3:
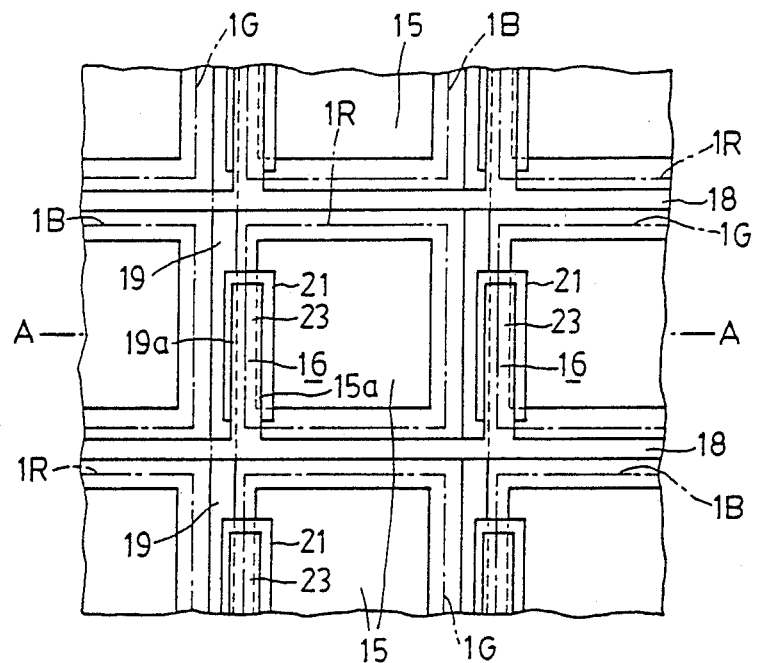
FIG. 3 is a prior art fragmentary plan view showing an inside portion of a prior art liquid crystal display device on the side of thin film transistors.
Figure 4:
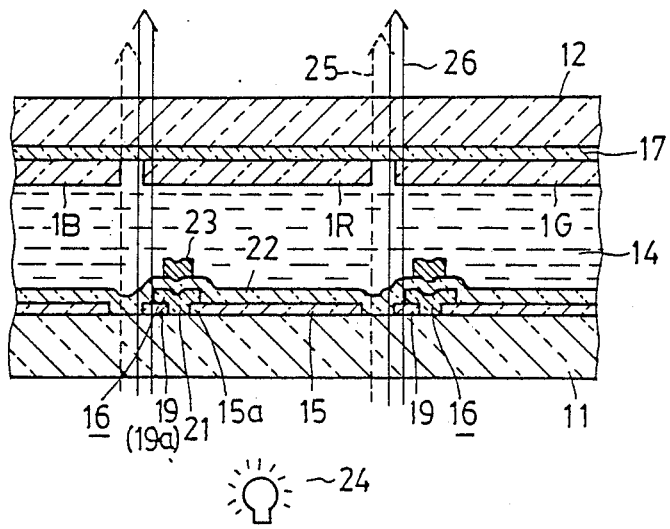
FIG. 4 is a view corresponding to a section taken along line A—A in FIG. 3 showing the prior art liquid crystal display device.
Figure 5:
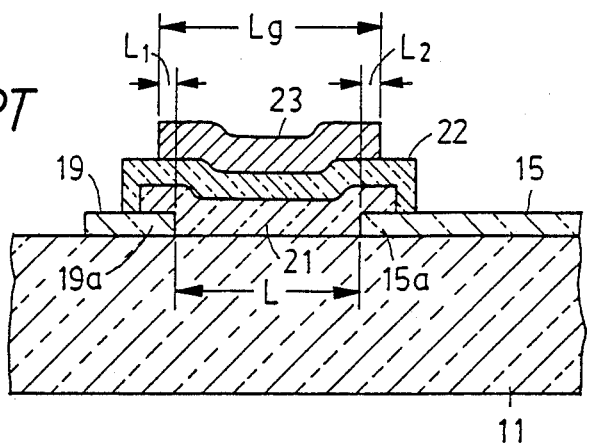
FIG. 5 is a fragmentary sectional view showing a thin film transistor used in the prior art liquid crystal display device.
Figure 8:
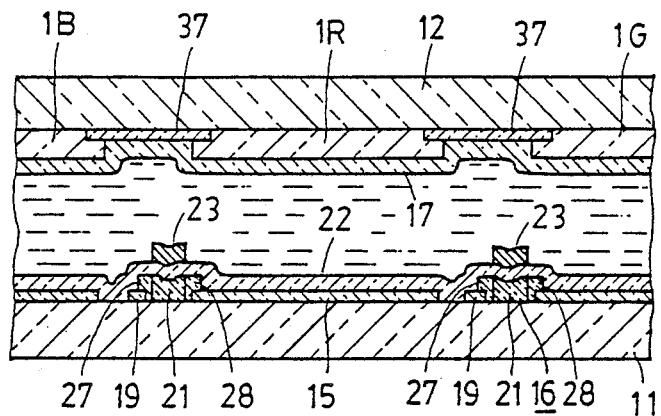
FIG. 8 is a fragmentary sectional view showing an embodiment of the liquid crystal display device according to the invention.

FIG. 8 shows a fragmentary sectional view of a liquid crystal display device, which is produced using the array of display electrodes 15 and thin film transistors 16 obtained by the method described above with reference to FIGS. 6A to 6E. In the Figure, parts like those in FIGS. 3, 4 and 7 are designated by like reference numerals and symbols.

This example is a color liquid crystal display device, which has color filters 1R, 1G and 1B provided on the inner surface of transparent substrate 12 and metal light-blocking layers 37 closing gaps between adjacent color filters. The light-blocking layers 37 may be made of aluminum, chromium, etc. and have a thickness of 2,000 to 3,000 angstroms. They may be formed by means of deposition or spattering. In the example of FIG. 8, the light-blocking layers 37 are first formed on the transparent substrate 12, then the color filters 1R, 1G and 1B are formed, and then common electrode 17 is formed on the entire surface of the color filters and light-blocking layers.

Figure 9:
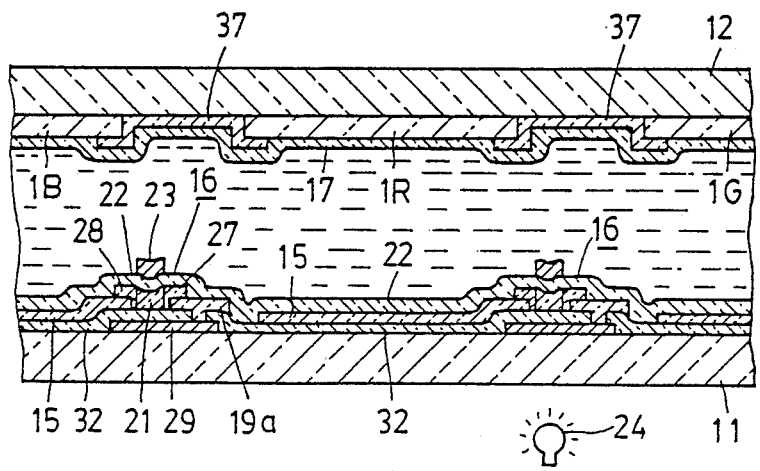
FIG. 9 is a fragmentary sectional view showing a different embodiment of the liquid crystal display device according to the invention.

FIG. 9 shows a fragmentary sectional view of a liquid crystal display device, which is produced using the array of display electrodes 15 and thin film transistors 16 obtained by the method described before with reference to FIGS. 7A to 7I. In FIG. 9, parts like those in FIGS. 3, 4 and 7A to 7I are designated by like reference numerals and symbols. In this example, the color filters 1R, 1G and 1B are first formed on the transparent substrate 12, then the metal light-blocking layers 37 are formed, and then the common electrode 17 is formed.

The description so far has been concerned with color liquid crystal display devices. However, the invention is applicable to monochromic liquid crystal display devices as well. Further, while the above description has been concerned with square picture element electrodes arranged as display electrodes 15 in a matrix array, the invention is also applicable to the cases of various other types of display electrodes. For example, according to the invention seven bar-like segment display electrodes arranged in the form of a figure eight may be selectively driven for the display of numerals. Further, the invention is applicable not only to liquid crystal display devices of the transmission type but also to those of the reflection type.

With the liquid crystal display device and the method of manufacturing the same as described above according to the invention, each thin film transistor 16 in the device has a channel defined between ohmic contact layers 27 and 28. Length L of the channel has a value slightly smaller than length $L_3$ of gate electrode 23. Further, the gate electrode 23 very slightly overlies the ohmic layers 27 and 28 when viewed in the perpendicular direction to the transparent substrate 11. Since the channel is formed through ion implantation with the gate electrode 23 used as a mask, no strict relative positioning is needed between the mask used for the formation of source buses 19 and display electrodes 15 and the mask used for the formation of gate electrodes 23. Instead, the channel is automatically determined by the gate electrode 23. Even a channel having a short length L, therefore, can be formed accurately.

By reducing channel length L, therefore, it is readily possible to reduce the turn-on time of the thin film transistor 16 and increase the drain current therein. Besides, it is possible to arrange the elements such that the gate electrode 23 overlies the source and drain electrodes 19a and 15a constituted by ohmic contact layers 27 and 28 only very slightly. The parasitic capacitance between the electrodes thus can be reduced, which improves the switching speed. Further, the "on" resistance can be reduced. Still further, dispersion of characteristics can be reduced to permit a uniform large display area with high precision.

Further, ion implantation is done after display electrodes 15, source buses 19, gate insulating film 22, gate electrodes 23 and gate buses have been formed. The display electrodes 15 and the source buses 19 are thus insulated from the gate electrodes 23. Further, parts other than gate electrodes 23 and gate buses are isolated from the liquid crystal by the gate insulating film 22. This is desired from the standpoint of the stability of the thin film transistor. In other words, the structure obtained after the step shown in FIG. 6F can be used directly, i.e., without need of formation of any protective layer, to produce a liquid crystal display device. Thus, the manufacturing process can be simplified.

Further, with the provision of opaque metal layers 29 as shown in FIGS. 7A to 7I, light from light source 24 for display or other external light is blocked by the layers 29 and never reaches the semiconductor layers 21. Thus, it is possible to ensure a sufficiently high "off" resistance of the thin film transistors 16 and hence a sufficiently high on-to-off current ratio thereof. Satisfactory contrast thus can be obtained even when thin film transistiors 16 are driven with a high duty ratio. Further, since the opaque metal layers 29 are formed along with the source buses 31, they can be formed comparatively easily and without particularly complicating the structure. An intent to increase the density of display electrodes 15 will lead to a sacrifice in the width of source buses 31 and increase the possibility of occasional disconnection of the buses. The formation of second source buses 19 alleviates this difficulty. That is, the second source buses 19 provide for a double-layer structure of source buses to improve reliability and increase yield even with a high-density large-area liquid crystal display device.

In a still further aspect, with the prior art liquid crystal display device shown in FIGS. 3 and 4, light from light source 24 is transmitted through a selected source bus 19, between which and common electrode 17 a voltage is applied, thus deteriorating the contrast of display. Particularly in the case of a color display, the display color becomes lighter. With the liquid crystal display device according to the invention, source buses 31 formed together with opaque metal layers 29 are opaque. Therefore, light is never transmitted through any selected source bus 31. The contrast thus is improved, and also there is no possibilitty for the display color to become lighter.

Furthermore, with the provision of light-blocking layers 37 to close the gaps between adjacent color filters as shown in FIGS. 8 and 9, there is no possibility of transmission of undesired light (i.e., light 25, 26 shown in FIG. 4) through the gaps between adjacent color filters. This promotes the improvement of the contrast and color purity, and hence the image quality. Further, the formation of color filters 1R, 1G and 1B produces surface level differences along the edges of the filters. These stepped filter edges are liable to cause separation of a portion of the common electrode 17 overlying a color filter. Even if this results, light-blocking layers 37 may maintain electric connection to the common electrode 17. To this end, the structure of FIG. 9 is preferred to the structure of FIG. 8. In addition, with the common electrode 17 formed on the previously formed color filters, voltage application across part of liquid crystal 14 between common electrode 17 and any display electrode 15 may be done more effectively than in the case of the prior art structure shown in FIG. 4.

It may be thought to form light-blocking layers 37 as a black filter. The black filter, however, is formed as a lamination of a red filter, a green filter and a blue filter. Therefore, the mask alignments involved are cumbersome. In addition, a considerable thickness is necessary to be able to block light sufficiently. This means that the formation of the black filter requires a great deal of attention. In contrast, the metal light-blocking layers 37 may be formed easily.

What is claimed is:

1. A liquid crystal display device comprising first and second transparent substrates closely spaced apart and facing each other, a liquid crystal sealed between said transparent substrates, a plurality of display electrodes made of ITO arranged in rows and columns on the inner surface of said first transparent substrate, thin film transistors formed on said first transparent substrate and each having a drain connected to one of said display electrodes, first source buses formed of the same material as said display electrodes and extending along corresponding columns of said display electrodes, each said source bus having source electrodes of said thin film transistors integrally formed therewith adjacent corresponding ones of said display electrodes, an opaque metal layer formed on said first transparent substrate and under each said thin film transistor, an insulating layer formed between each said metal layer and said thin film transistor, second source buses of the same material as said opaque metal layers formed integrally therewith to extend under said insulating layer along respective ones of said first source buses and connected thereto through holes formed in said insulating layer, and a transparent common electrode formed on and substantially over the entire inner surface of said second transparent substrate, said thin film transistors being selectively controlled for switching to apply a voltage between selected display electrodes and said common electrode for display, said thin film transistors each including a semiconductor layer which extends between the corresponding display electrode and the source electrode, opposite marginal edges of said semiconductor layer partly overlying said display electrode and said source electrode on the side thereof opposite said first transparent substrate, a gate insulating film formed on said semiconductor layer entirely on the side thereof opposite said first transparent substrate, and a gate electrode formed on said gate insulating film, each of said thin film transistors including a pair of gaps which are defined respectively between the opposite ends of said gate electrode and said display electrode and the source electrode when viewed in a direction perpendicular to said first transparent substrate, the width of each of said gaps being less than the thickness of said semiconductor layer, portions of said semiconductor layer overlying said display electrode and source electrode being ohmic layers having implanted ions of a concentration higher than an impurity concentration of a channel region of said semiconductor layer under said gate electrode, said channel region having the same length as the width of said gate electrode.

2. The liquid crystal display device according to claim 1, wherein light-blocking layers of an opaque metal are formed on portions of said second transparent substrate corresponding to gaps between adjacent display electrodes.

3. The liquid crystal display device according to claim 2, wherein color filters are formed on said second transparent substrate such that they face said display electrodes.

4. The liquid crystal display device according to claim 3, wherein said light-blocking layers are formed between said common electrode and said second transparent substrate.

5. The liquid crystal display device according to claim 4, wherein said light-blocking layers partly overlie said color filters on the side thereof opposite said second transparent substrate.

6. The liquid crystal display device according to claim 3 wherein said display electrodes are picture element electrodes arranged in a matrix array, said thin film transistors connected to the picture element electrodes in each column have their source electrodes connected to a corresponding one of said first source buses, said thin film transistors connected to the picture element electrodes in each row of said matrix array have their gate electrodes connected to a corresponding one of a plurality of gate buses, and said color filters consist of a plurality of different color filters which are substantially uniformly distributed.

7. The liquid crystal display device according to claim 1 wherein said display electrodes are picture element electrodes arranged in a matrix array, said thin film transistors connected to the picture element electrodes in each column have their source electrodes connected to a corresponding one of said first source buses, and said thin film transistors connected to the picture element electrodes in each row of said matrix array have their gate electrodes connected to a corresponding one of a plurality of gate buses.

* * * * *